United States Patent [19]

Norton, Jr.

[11] Patent Number: 5,315,168
[45] Date of Patent: May 24, 1994

[54] PEAK HOLD CIRCUIT WITH IMPROVED LINEARITY

[75] Inventor: David E. Norton, Jr., Boulder, Colo.

[73] Assignee: Fujitsu Limited, Kanagawa, Japan

[21] Appl. No.: 54,035

[22] Filed: Apr. 28, 1993

[51] Int. Cl.$^5$ .............................................. H03K 5/24
[52] U.S. Cl. .................................... 307/351; 307/359; 307/352
[58] Field of Search ............... 307/350, 351, 352, 353, 307/356, 358, 359, 228, 261, 263, 494; 328/150, 151

[56] References Cited

U.S. PATENT DOCUMENTS

| | | | |
|---|---|---|---|
| 3,702,942 | 11/1972 | Aguirre | 307/352 |
| 3,733,553 | 5/1973 | Magnante et al. | 325/321 |
| 3,870,906 | 3/1975 | Hughes | 307/352 |
| 4,093,874 | 6/1978 | Pollitt | 307/352 |
| 4,495,429 | 1/1985 | Oda et al. | 307/358 |
| 4,697,098 | 9/1987 | Cloke | 307/354 |
| 4,992,674 | 2/1991 | Smith | 307/350 |
| 5,003,523 | 3/1991 | Wachi et al. | 369/44.34 |
| 5,016,005 | 5/1991 | Shaw et al. | 340/870.19 |
| 5,023,733 | 6/1991 | Koga et al. | 360/77.04 |
| 5,025,456 | 6/1991 | Ota et al. | 375/76 |
| 5,047,666 | 9/1991 | Astegher et al. | 307/353 |
| 5,105,316 | 4/1992 | Cronch et al. | 360/46 |

Primary Examiner—Timothy P. Callahan
Assistant Examiner—My-Trang Nu Ton
Attorney, Agent, or Firm—Curtis, Morris & Safford

[57] ABSTRACT

A peak hold circuit includes an operational amplifier in a continually closed feedback loop and a peak hold capacitor with a discharge path. An input signal is received at a first input of the amplifier, and the output of the amplifier is fed to a first transistor then fed back therefrom to a second input of the amplifier. A current sink is coupled to the first transistor for drawing a current therefrom so that the feedback signal is continually provided to the second amplifier input, ensuring that the amplifier is in a continually closed feedback loop. The output of the amplifier is supplied to the peak hold capacitor through a second transistor.

10 Claims, 3 Drawing Sheets

PEAK HOLD CIRCUIT WITH IMPROVED LINEARITY

BACKGROUND OF THE INVENTION

This invention relates to an electrical circuit for detecting and holding peak values in a signal supplied thereto. More specifically, the present invention is directed to a peak hold circuit with improved linearity and reduced noise sensitivity.

A conventional peak hold circuit is shown in FIG. 1. An input signal Vinput is supplied to an input terminal 100, and from there to the base of transistor 110. A voltage source 105 is coupled to the collector of transistor 110, and a peak hold capacitor 115 is coupled to the emitter of this transistor. The voltage at the emitter of transistor 110 generally follows the voltage applied to its base. A reset switch 120 and an output terminal 125 are also coupled to the emitter of transistor 110.

Initially, after the reset switch has been opened, the peak hold capacitor 115 stores no charge. So, as the amplitude of Vinput increases, capacitor 115 accumulates charge, and the voltage Vpeak at the emitter of transistor 110 also increases. When the amplitude of Vinput falls below the emitter voltage of transistor 110, the transistor 110 turns off, and, as capacitor 115 lacks a discharge path, the voltage thereacross Vpeak remains unchanged. If the amplitude of Vinput rises above the amplitude Vpeak, transistor 110 turns on and Vpeak increases until a new maximum amplitude is reached. This description excludes the offset caused by the base to emitter voltage Vbe of transistor 110.

The circuit shown in FIG. 1 exhibits two notable problems, high noise sensitivity and poor linearity.

The noise sensitivity problem is illustrated in FIG. 2. As can be seen, if the amplitude of Vinput increases due to a noise burst, then the voltage Vpeak across capacitor 115 reflects this increased amplitude, giving a false impression of the true peak amplitude of Vinput.

The linearity problem is due to the nature of transistor 110, which requires a larger base to emitter voltage Vbe as its collector current increases. To overcome this problem, it is conventional to make the signal swing of Vinput, that is, the magnitude of the change in amplitude, be large so that when Vinput is at a small amplitude, such as 10% of its maximum amplitude, the percent error due to the nonlinear relationship between current and Vbe is within a specified target. However, the requirement for a large signal swing prevents reduction in the voltage source Vcc, and thus impedes cost and size reduction of the peak hold circuit.

A peak hold circuit with improved linearity is shown in FIG. 3, and comprises an input terminal 500 coupled to a positive input of an operational amplifier 510, which has an output coupled to a diode 520; the output of the diode is fed back to a negative input of the amplifier 510, and also is supplied to a peak hold capacitor capacitor 530 and to an output terminal 540.

When a peak value of the input signal is being acquired, that is, as Vinput increases, the output of the amplifier 510 also increases, diode 520 conducts and charge is stored in peak hold capacitor 530. During acquisition, amplifier 510 is in a closed feedback loop so changes in current density of transistor 520 are automatically compensated.

However, the circuit of FIG. 3 has an open loop overshoot problem. Specifically, after a peak value has been acquired, diode 520 stops conducting current so that amplifier 510 operates in an open loop and overshoots, causing a transient error comparable to the error due to noise experienced in the circuit of FIG. 1. To overcome the open loop overshoot problem, it is conventional to provide the amplifier 510 with a fast slew rate, that is, a rapid change in its output in response to large changes in its input, and also a small propagation delay with respect to Vinput, so that the error is not dependent on previous values of Vinput.

Although the circuit of FIG. 3 exhibits improved linearity, it requires a high performance operational amplifier which impedes cost reduction. Furthermore, this circuit has a noise sensitivity problem similar to that of FIG. 1.

OBJECTS AND SUMMARY OF THE INVENTION

Therefore, an object of the present invention is to provide a peak hold circuit which avoids the aforementioned disadvantages of the prior art.

Another object of this invention is to provide a peak hold circuit with improved linearity.

A further object of this invention is to provide a peak hold circuit with reduced noise sensitivity.

Still another object of this invention is to provide a peak hold circuit which operates satisfactorily with relatively low cost components.

In accordance with this invention, an apparatus for detecting peak values in an input signal includes an operational amplifier in a continually closed feedback loop and a peak hold capacitor with a discharge path.

The input signal is received at a first input of the amplifier, and the output of the amplifier is fed to a first transistor and then fed back therefrom to a second input of the amplifier. A current sink is coupled to the first transistor for drawing a current therefrom so that the feedback signal is continually provided to the second amplifier input, ensuring that the amplifier is in a continually closed feedback loop.

Thus, a peak hold circuit according to the present invention has improved linearity and does not require particularly high performance components.

Advantageously, the output of the amplifier is supplied to the peak hold capacitor through a second transistor, and a discharge path which permits charge to drain from the peak hold capacitor also is coupled to the capacitor.

Consequently, the peak hold circuit according to the present invention also has reduced noise sensitivity.

The above, and other objects, features and advantages of the present invention will be apparent in the following detailed description of the preferred embodiments of the present invention when read in conjunction with the accompanying drawings.

DETAILED DESCRIPTION OF THE PREFERRED EMBODIMENTS

Figure 4:
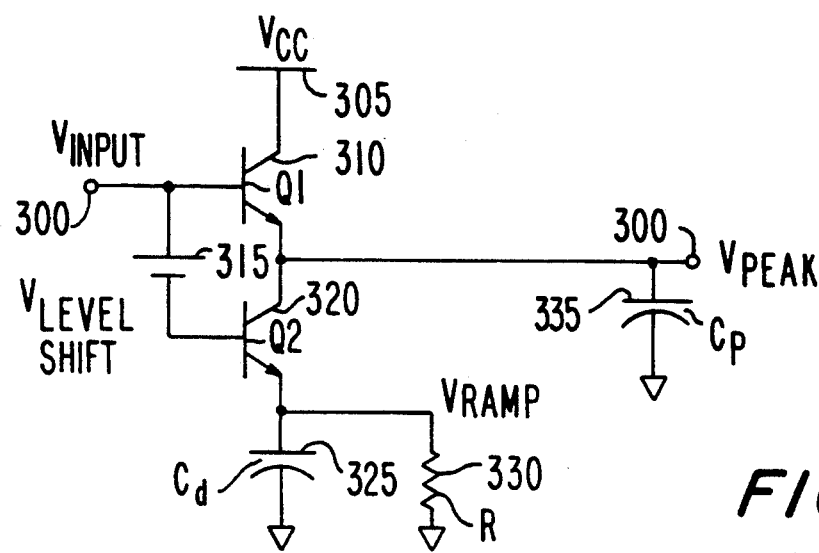
FIG. 4 is a schematic diagram illustrating another peak hold circuit.

In application Ser. No. 07/769,405, the noise sensitivity problem has been addressed by the present inventor through provision of a discharge path for the peak hold capacitor. FIG. 4 illustrates a peak hold circuit including a discharge path. Input terminal 300, voltage source Vcc 305, peak hold transistor transistor 310, peak hold capacitor capacitor 335 and output terminal 340 are similar to the corresponding elements shown in FIG. 1. The emitter of transistor 310 is coupled to the collector of a discharge transistor 320. A voltage source 315 is coupled between the base of transistor 310 and the base of transistor 320 to compensate for the voltage drop between the base and emitter of transistor 310. The voltage source 315 may be, for example, a diode. Between the emitter of transistor 320 and ground, a discharge capacitor 325 and a resistor 330 are connected in parallel to produce a voltage ramp when transistor 320 is turned off, as when Vinput falls below the emitter voltage of transistor 320.

Figure 5:
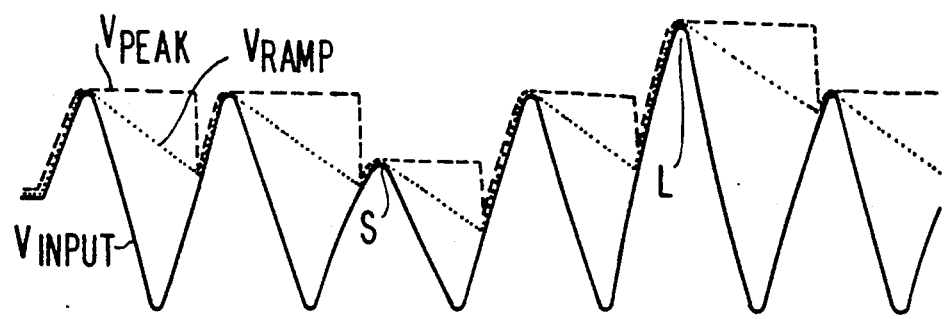
FIG. 5 is a waveform chart referred to in explaining the circuit of FIG. 4.

As can be seen in FIG. 5, initially both Vpeak and the voltage measured at the emitter of transistor 320, Vramp, follow Vinput while Vinput increases. As Vinput decreases, Vpeak remains at the maximum amplitude of Vinput due to lack of a discharge path, and Vramp begins to decrease slowly as capacitor 325 discharges through resistor 330. When Vinput intersects Vramp due to an increase in Vinput, a decrease in Vramp, or a combination thereof, transistor 320 turns on and charge flows from peak hold capacitor 335 through transistor 320 to capacitor 325 and resistor 330, thus discharging the peak hold capacitor, until Vpeak is reduced to the present amplitude of Vinput, at which time transistor 310 turns on. Thus, Vpeak reflects the maximum amplitude of each pulse in Vinput, even for a small pulse S or a large pulse L. To reduce the effect of noise, such as that reflected in pulses S and L, the peaks are averaged in a subsequent circuit, not shown.

Figure 1:
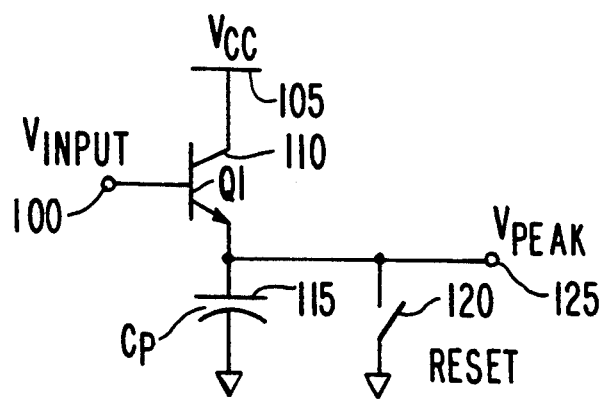
FIG. 1 is a schematic diagram illustrating a conventional peak hold circuit.
Figure 2:
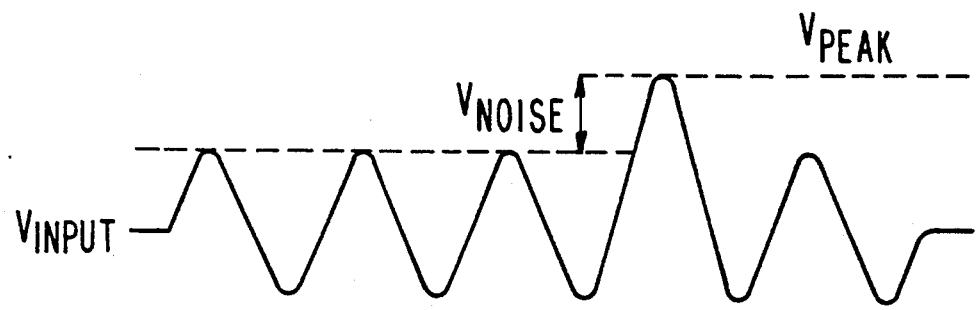
FIG. 2 is a waveform chart referred to in explaining the circuit of FIG. 1.

However, the circuit of FIG. 4 has a similar linearity problem to that of FIG. 1.

Figure 6:
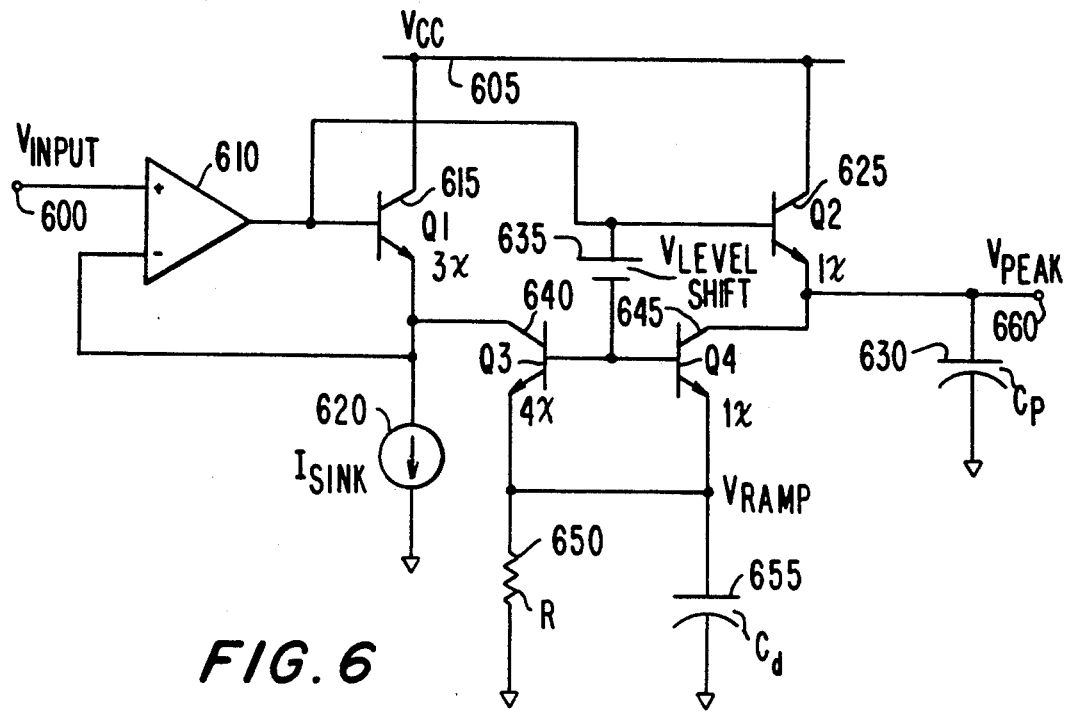
FIG. 6 is a schematic diagram of a peak hold circuit according to the present invention.

Referring now to FIG. 6, there is illustrated a peak hold circuit according to the present invention. The apparatus illustrated in FIG. 6 is adapted to detect and maintain peak values in an input signal Vinput supplied thereto, and exhibits improved linearity and reduced noise sensitivity relative to conventional peak hold circuits.

The circuit illustrated in FIG. 6 comprises an input terminal 600, an operational amplifier 610, a transistor 615, a current sink Isink 620, a transistor 625, a peak hold capacitor 630, transistors 640, 645, a discharge resistor 650 and a discharge capacitor 655. This circuit may generally be fabricated in a low cost, monolithic manner.

An input signal Vinput is supplied to input terminal 600, and from there to a positive input of operational amplifier 610. An output of the operational amplifier is respectively supplied to the base terminals of transistors 615 and 625. An operating voltage Vcc is supplied from a voltage source 605 to the collector terminals of transistors 615 and 625.

The transistor 625 is adapted to provide a signal at its emitter terminal which follows the signal supplied to its base, and to supply its emitter signal to peak hold capacitor 630. Initially, it may be assumed that capacitor 630 has no charge stored thereacross. As the amplitude of Vinput increases, transistor 625 is turned on to charge capacitor 630, and the voltage Vpeak at the emitter of transistor 625 also increases. When the amplitude of Vinput falls below the voltage across capacitor 630, transistor 625 turns off, and, as capacitor 630 lacks an immediate discharge path, Vpeak remains unchanged. If the amplitude of Vinput rises above the previous peak amplitude Vpeak, then transistor 625 turns on, and Vpeak increases until a new maximum amplitude is reached.

The emitter of transistor 615 is fed back to a negative input of the operational amplifier 610 and also is coupled to a current sink 620. Transistor 615 is continually in an "on" or conducting state, because current sink 620 continually draws collector-emitter current from transistor 615. The current drawn by current sink 620 must be small, as it creates an error in the Vpeak value, explained below. However, since the current drawn by current sink 620 ensures that operational amplifier 610 is in a continually closed feedback loop, the amplifier 610 need not have a particularly fast slew time or short propagation delay, since open loop operation, with its problems of transients and overshoot, is avoided.

A discharge circuit for discharging peak hold capacitor 630 is comprised of a voltage source Vshift 635, transistor 645, discharge resistor 650, and discharge capacitor 655.

Voltage source 635 is coupled to the output of the operational amplifier 610 and to the base of transistor 625, and is adapted to provide an offset output in which the output of the amplifier 610 is offset by the base to emitter voltage difference in each of transistors 615 and 625. This offset output is applied to the base of transistor 645. The purpose of offsetting the output of amplifier 610 before applying it to the base of transistor 645 is to permit transistor 645 to be "on" simultaneously with transister 625 during peak acquisition. Voltage source 635 may be, for example, a diode connected to a current sink or a resistor connected to a ground.

The emitter of transistor 625 is coupled to the collector of transistor 645; and discharge capacitor 655 and resistor 650 are connected in parallel between the emitter of transistor 645 and ground to produce a ramp voltage Vramp. When Vinput increases, Vramp also increases because during peak acquisition all of the transistors shown in FIG. 6 are "on". After a peak has been acquired, that is, as Vinput begins to decrease below the peak voltage stored on capacitor 630, transistor 615 is "on" and the remainder of the transistors are "off".

As Vinput continues to decrease, Vpeak remains at the previously stored maximum amplitude of Vinput due to lack of a discharge path for capacitor 630, as noted above, and Vramp begins to decrease slowly as capacitor 655 discharges through resistor 650. When Vinput intersects Vramp due to a subsequent increase in Vinput, a decrease in Vramp, or a combination thereof, transistor 645 turns on and charge flows from capacitor 630 through transistor 645 to capacitor 655 and resistor 650, thereby discharging the peak hold capacitor until Vpeak is reduced to the present amplitude of Vinput, at which time transistor 625 turns on. Thus, Vpeak reflects the maximum amplitude of each pulse in Vinput. To reduce the effect of noise, the peaks are averaged in a subsequent circuit, not shown.

In the present invention, component values are scaled so that the current densities in transistors 615 and 625 are approximately the same. Since transistor 615 is in a feedback path, changes in its base to emitter voltage, corresponding to changes in the amplitude of the output of amplifier 610, are automatically compensated.

Transistors 615 and 625 are matched so that their current densities are the same, or at least highly similar, which may be done by fabricating them in a substantially identical manner and placing them in close proximity on an integrated circuit. The collectors of transistors 615 and 625 are each connected to voltage source 605, and their bases are each connected to the output of operational amplifier 610. Consequently, the emitter outputs of transistors 615 and 625 are also the same or highly similar, so that changes in the base to emitter voltage of transistor 625 are automatically compensated in like manner as changes in the base to emitter voltage of transistor 615. Thus, the charging current for capacitor 630, from the emitter of transistor 625, has improved linearity relative to the prior art.

The bases of transistors 640 are 645 are connected in common, and the emitters of these transistors are connected to discharge capacitor 655. The collector of transistor 640 is coupled to the emitter of transistor 615, that is, transistor 640 is adapted to present a portion of the current produced at discharge capacitor 655 to transistor 615. The collector of transistor 645 is coupled to the emitter of transistor 625, permitting transistor 645 to present a portion of the current produced at discharge capacitor 655 to transistor 625.

The transistors 640 and 645 are adapted to split the charging current for discharge capacitor 655, and this split is unequal in view of the charging current for peak hold capacitor 630 and the current drawn by current sink 620. The charging current $i_{Cd}$ for discharge capacitor 655, having a capacitance Cd, is given by the following:

$$i_{cd} = Cd \cdot \frac{d}{dt} V\text{ramp}$$

The charging current $i_{Cp}$ for peak hold capacitor 630, having a capacitance Cp, is given by the following:

$$i_{cp} = Cp \cdot \frac{d}{dt} V\text{speak}$$

During acquisition of a peak, the voltage Vramp at the discharge capacitor 655 changes with the voltage Vpeak at the peak hold capacitor 630. Therefore, the derivative of these voltages is substantially the same, and, it is convenient to indicate the currents $i_{Cd}$ and $i_{Cp}$ as a function of capacitance only. In one embodiment, discharge capacitor 655 has a capacitance of 270 pF; its current is referred to herein as 270 pF worth of current.

Resistor 650 has a fairly large value, on the order of about 22 kiloohms. The current from discharge capacitor 655 substantially avoids resistor 650 since the change in Vramp with respect to time is very large, and the current in the discharge capacitor 655 is many times larger than the resistance of resistor 650. The current from discharge capacitor 655 is split between transistors 640 and 645, in proportion to the ratio of the area of their emitters, which, in one embodiment, is 4× to 1×. Thus, four-fifths of the current, or 216 pF worth of current, is presented to the emitter of transistor 640 and one-fifth of the current, or 54 pF worth of current, is presented to the emitter of transistor 645.

Since the emitter of transistor 625 is coupled to the peak hold capacitor 630, current from the peak hold capacitor 630 is also presented to the emitter of transistor 625. In the embodiment being described, capacitor 630 exhibits a capacitance of about 15 pF so that the emitter of transistor 625 is presented with a total of 54+15=69 pF worth of current.

The current sink 620 is also coupled to the emitter of transistor 615. If current sink 620 draws too little current, then transistor 615 turns off. However, the current drawn by current sink 620 ultimately creates an error in the peak voltage Vpeak as it prevents the current densities in transistors 615 and 625 from being identical. In one embodiment, the current drawn by the current sink is approximately 5% of the discharge current $i_{Cd}$ or about 10 pF worth of current. Thus, the emitter of transistor 615 is presented with a total of 216+10=226 pF worth of current. As a worst case, if the current drawn by the current sink is approximately 100% of the discharge current $i_{Cd}$, then it is estimated that the error in the peak voltage Vpeak is about 2%.

In the embodiment wherein the area of the emitter of transistor 615 is 3×, and the area of the emitter of transistor 625 is 1×, that is, these emitters have an areal ratio of 3:1, the emitter of transistor 615 has, as noted, 226 pF worth of current presented to it, and the emitter of transistor 625 has, as noted, 69 pF worth of current presented to it, so the current presented to these emitters has a ratio of 226:69 or 3.27 : 1.

Since the ratio of the areas of the emitters of transistors 615 and 625, 3:1, is approximately the same as the ratio of currents presented to these emitters, 3.27 : 1, the current density of transistor 615 is approximately the same as the current density of transistor 625. Ideally, the ratio of the areas of the emitters should be the same as the ratio of currents presented to these emitters, but this was not done in the embodiment being described due to integrated circuit design constraints.

In one embodiment, all the elements of FIG. 6 are fabricated as one integrated circuit chip, except discharge capacitor 655 is provided as an external element so it can be tuned in accordance with the data rate of Vinput. However, where discharge capacitor 655 is coupled to the circuit, parasitic capacitance occurs. The value of the parasitic capacitance is on the order of magnitude of the value of the capacitance of peak hold capacitor 630. In this case, the capacitance of discharge capacitor 655 is chosen to be large relative to the capacitance of peak hold capacitor 630 so that the parasitic capacitance does not have a significant effect.

If discharge capacitor 655 is fabricated on the same integrated circuit chip as the rest of the circuit, then parasitic capacitance is not an issue, and the value of the capacitance of discharge capacitor 655 can be closer to the value of the capacitance of capacitor 630. In that case, the areal ratio of the emitters of transistors 640 and 645 is chosen in the range of 1:1.

Figure 7:
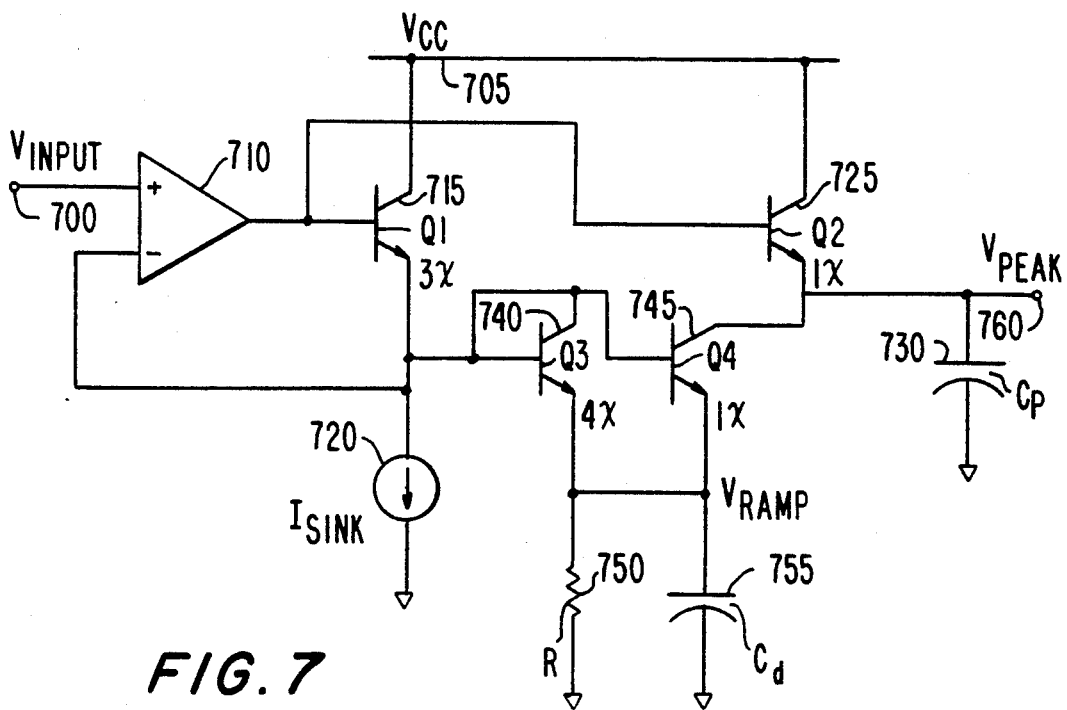
FIG. 7 is a schematic diagram of another peak hold circuit according to the present invention.

Another embodiment of a peak hold circuit according to the present invention is shown in FIG. 7. The difference between this circuit and the circuit of FIG. 6 is that the base to emitter voltage of transistor 715 in FIG. 7 is used in place of the voltage source 635 in FIG. 6.

As is evident from FIG. 7, the base and collector of transistor 740 are connected in common, so that transistor 740 acts as a diode, and could be replaced by a diode which is matched to transistor 745.

Figure 3:
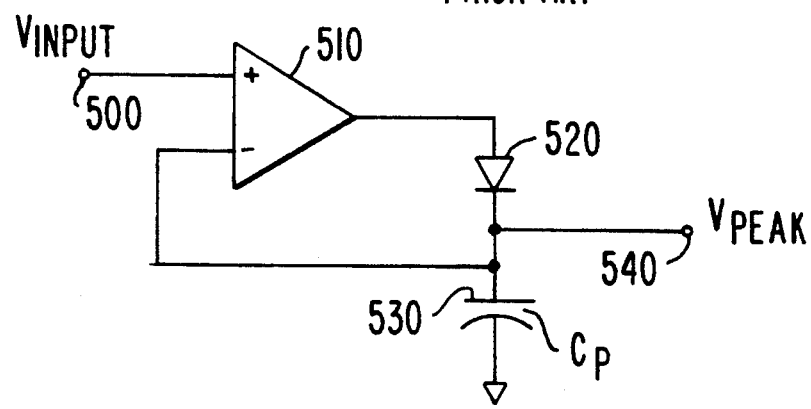
FIG. 3 is a schematic diagram illustrating a further peak hold circuit.

Simulations comparing the circuits shown in FIGS. 3 and 7 were performed. The percent error in the detected peak value, measured relative to the desired value, when Vinput is at 10% of its peak value, decreased by a factor of about 8 for reasonably good assumptions regarding component tolerances, and a factor of about 3 for worst case assumptions. In other words, when the input signal is at a small percentage of its peak value, a circuit according to the present invention provides a smaller error in its Vpeak output, and this error is in the range of only 10% to 35% of the error present in the conventional peak hold circuit. These simulation results have also been verified in operational hardware.

Although illustrative embodiments of the present invention, and various modifications thereof, have been described in detail herein with reference to the accompanying drawings, it is to be understood that the invention is not limited to these precise embodiments and the described modifications, and that various changes and further modifications may be effected therein by one skilled in the art without departing from the scope or spirit of the invention as defined in the appended claims.

What is claimed is:

1. Apparatus for detecting peak values in an input signal, said apparatus comprising:
    operational amplifier means having a first amplifier input for receiving said input signal, a second amplifier input for receiving a feedback signal and an amplifier output for providing an amplified signal;
    first transistor means for receiving said amplified signal and having a first transistor output for providing said feedback signal;
    current sink means coupled to said first transistor output for drawing a current from said first transistor means so that said feedback signal is continually provided from said first transistor means to said second amplifier input;
    peak hold capacitor means for storing a charge representing a peak amplitude of said input signal;
    second transistor means for receiving said amplified signal and for coupling said amplified signal to said peak hold capacitor means; and
    discharge means for discharging said peak hold capacitor means.

2. The apparatus of claim 1, wherein said discharge means includes third transistor means coupled to said peak hold capacitor means for draining charge therefrom.

3. The apparatus of claim 2, wherein said second transistor means decouples said amplifier output from said peak hold capacitor means after a peak value of said input signal is stored on said peak hold capacitor means; and said discharge means also includes discharge capacitor means coupled to said third transistor means for storing charge when said peak hold capacitor means stores charge and for discharging the charge stored thereby when said amplifier output is decoupled from said peak hold capacitor means.

4. The apparatus of claim 3, wherein said discharge capacitor means generates a ramp signal while discharging, and said third transistor means discharges said peak hold capacitor means when the value of said ramp signal is substantially equal to the value of said input signal.

5. The apparatus of claim 1, wherein said first transistor means has a first current density, and said second transistor means has a second current density substantially equal to said first current density.

6. The apparatus of claim 5, wherein said discharge means includes third transistor means for draining charge from said peak hold capacitor means.

7. The apparatus of claim 6, further including fourth transistor means for coupling said first transistor means to said discharge means so that current from said first transistor means can flow to said discharge means.

8. The apparatus of claim 7, wherein a first current flows through said second transistor means when said peak hold capacitor means charges; wherein said discharge means includes discharge capacitor means coupled to said third transistor means and to said fourth transistor means so that a second current flows through said third and fourth transistor means to said discharge capacitor means when said peak hold capacitor means discharges; wherein a first part of said second current flows through said second transistor means to said third transistor means; and wherein a second part of said second current flows through said first transistor means to said fourth transistor means.

9. The apparatus of claim 7, further including a voltage source coupled between said operational amplifier means and said third and fourth transistor means.

10. The apparatus of claim 7, wherein said first transistor means is also coupled to said third transistor means.

* * * * *